United States Patent [19]
Anderson

[11] 4,061,800
[45] Dec. 6, 1977

[54] VAPOR DESPOSITION METHOD

[75] Inventor: Emmett R. Anderson, Los Gatos, Calif.

[73] Assignee: Applied Materials, Inc., Santa Clara, Calif.

[21] Appl. No.: 652,774

[22] Filed: Jan. 27, 1976

Related U.S. Application Data

[63] Continuation-in-part of Ser. No. 547,717, Feb. 6, 1975, abandoned.

[51] Int. Cl.² ............................................. B05D 3/06
[52] U.S. Cl. ........................................ 427/46; 118/49; 219/271; 219/275; 427/50
[58] Field of Search .............. 427/45, 46, 50, 248 R, 427/248 A, 248 B, 248 C, 248 E, 248 G, 248 H, 248 I, 249, 250, 251, 99, 167; 118/49; 219/271, 272, 275

[56] References Cited

U.S. PATENT DOCUMENTS

| | | | |
|---|---|---|---|
| 2,440,135 | 4/1948 | Alexander | 427/248 R |
| 2,584,660 | 2/1952 | Bancroft | 427/250 |
| 2,910,039 | 10/1959 | Patton et al. | 118/49 |
| 3,281,517 | 10/1966 | Hemmer et al. | 118/49 |
| 3,446,936 | 5/1969 | Hanson et al. | 219/271 |
| 3,574,650 | 4/1971 | House | 427/250 |
| 3,690,933 | 9/1972 | Cole | 427/250 |
| 5,598,384 | 8/1971 | Zucchinelli | 118/49 |

FOREIGN PATENT DOCUMENTS

| | | |
|---|---|---|
| 1,263,582 | 2/1972 | United Kingdom. |
| 1,298,453 | 12/1972 | United Kingdom ................... 427/54 |

*Primary Examiner*—John H. Newsome
*Attorney, Agent, or Firm*—Flehr, Hohbach, Test, Albritton & Herbert

[57] ABSTRACT

Method and apparatus for effecting vapor deposition of a material on an object. The material is vaporized in a closed chamber, and the pressure is allowed to build up in the chamber as the material vaporizes. Thereafter, the chamber is opened, and the vapor is applied to the object in a super-heated, high pressure state. If desired, additional materials can be injected into the chamber and added to the vapor before the chamber is opened.

6 Claims, 2 Drawing Figures

VAPOR DESPOSITION METHOD

CROSS-REFERENCE TO RELATED APPLICATION

This is a continuation-in-part of Ser. No. 547,717, filed Feb. 6, 1975 now abandoned.

BACKGROUND OF THE INVENTION

This invention pertains generally to the coating of materials with a vapor and more particularly to a method and apparatus for vaporizing a material and depositing vapor on an object in a super-heated, high pressure state.

Heretofore, coatings have been deposited on objects by techniques such as vaporization of material from an open source in reduced atmosphere and high vacuum. While these techniques are capable of producing coatings of good quality, they have certain limitations and disadvantages. In general, the kinetic energy of the vapor stream can be increased by making provision for placing an electric charge on the object to be coated, as practiced in ion plating. It is, however, difficult to provide the necessary charge on an object fabricated of a dielectric material. Ion plating also frequently adds undesirable heat energy to the object to be coated.

SUMMARY AND OBJECTS OF THE INVENTION

The invention provides a vapor deposition method and apparatus wherein the material to be deposited is vaporized in a closed chamber and the pressure of the vapor is allowed to increase as the material is vaporized. When the vapor has reached a desired pressure and temperature, the chamber is opened, and the super-heated, high pressure vapor is applied to the object. If desired, additional materials can be injected into the chamber and added to the vapor before the chamber is opened.

It is in general an object of the invention to provide a new and improved method and apparatus for effecting vapor deposition of a material on the object.

Another object of the invention is to provide a method and apparatus of the above character in which the material is vaporized in a closed chamber to provide a super-heated, high pressure vapor which is applied to the object.

Another object of the invention is to provide a method and apparatus of the above character in which materials can be added to the vapor in the closed chamber.

Additional objects and features of the invention will be apparaent from the following description in which the preferred embodiments are set forth in detail in conjunction with the accompanying drawings.

DESCRIPTION OF THE PREFERRED EMBODIMENT

Figure 1:
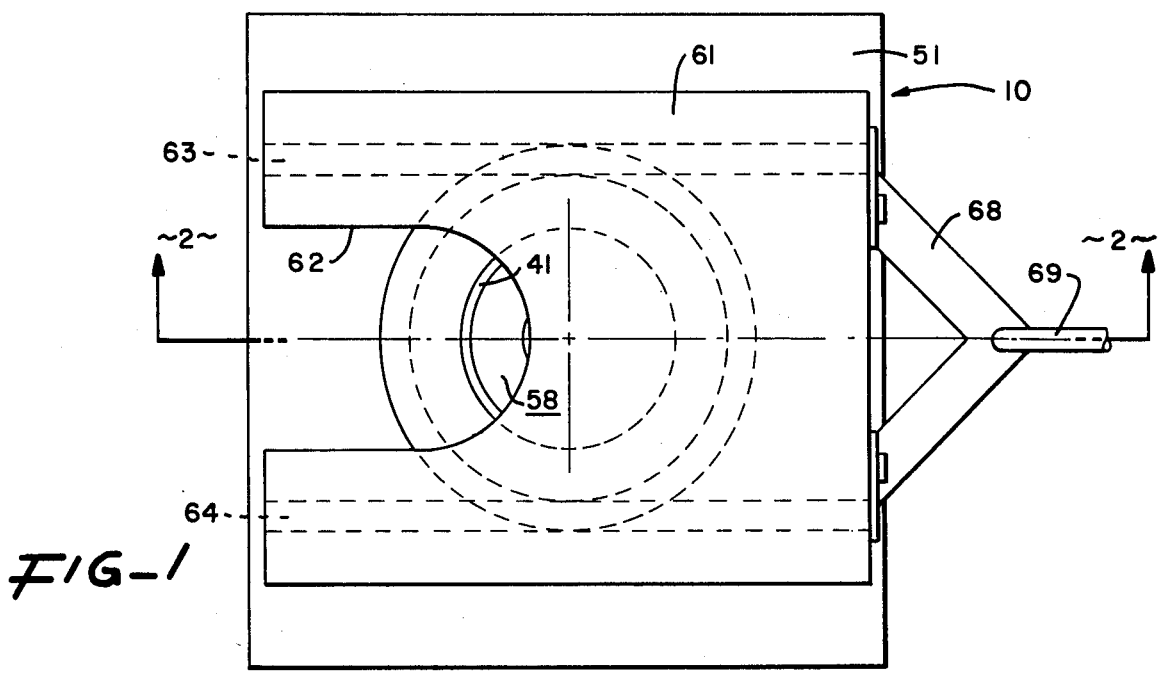
FIG. 1 is a top plan view of one embodiment of vapor deposition apparatus according to the invention.
Figure 2:
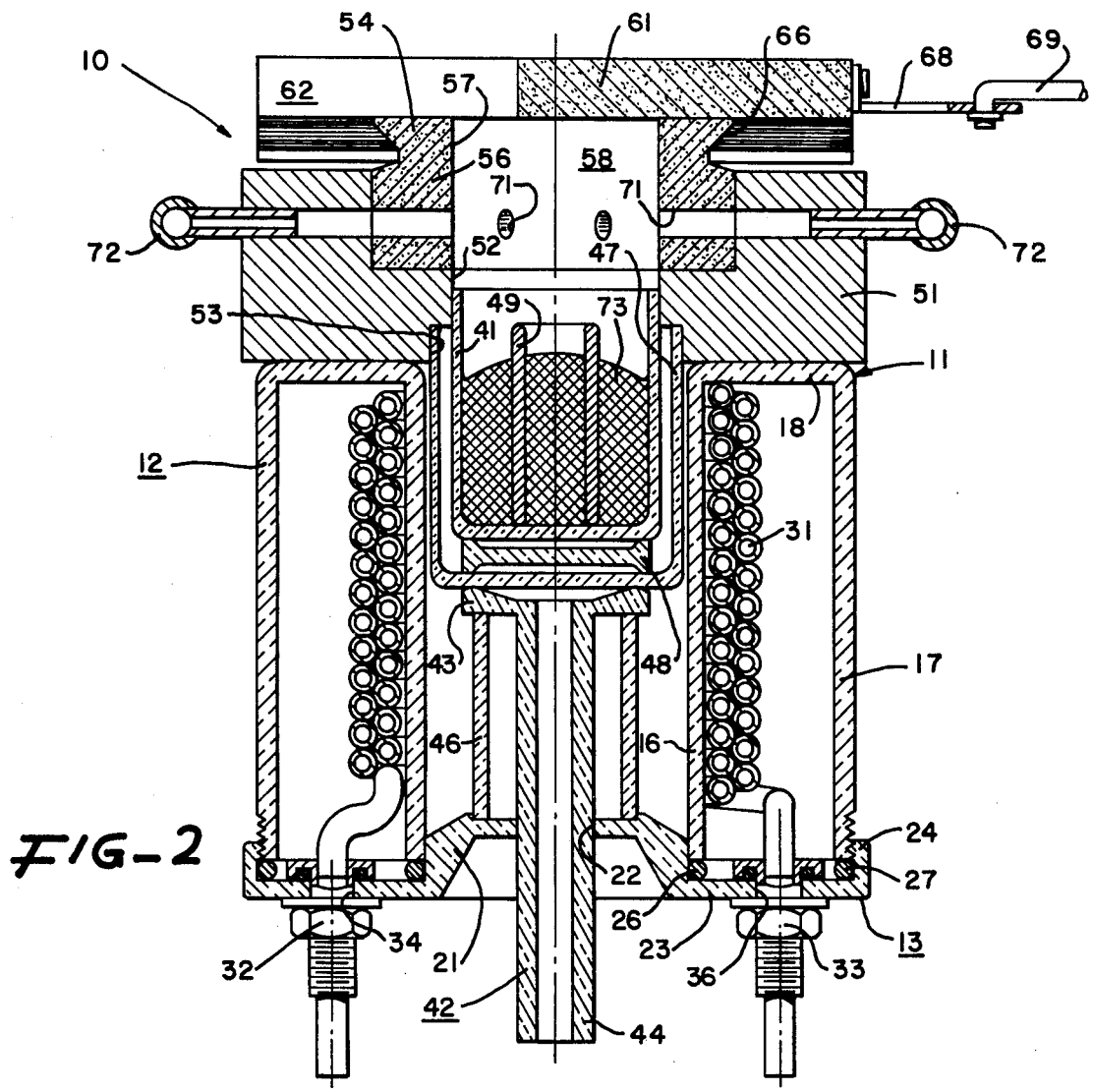
FIG. 2 is a cross sectional view taken along line 2—2 in FIG. 1.

As illustrated, the vapor deposition apparatus comprises a vapor source 10 having a housing assembly 11. This assembly is fabricated of a high temperature RF insulative material such as alumina or other suitable ceramic, and it includes a cover 12 and a base 13. The cover includes an inner side wall 16, an outer side wall 17, and an annular top wall 18. Side walls 16 and 17 are generally cylindrical, and they are disposed coaxially of each other. Base 13 includes a raised central portion 21, in which an axial opening 22 is formed, and an annular outer portion 23. The base also includes an internally threaded upstanding peripheral flange 24 in which the outer wall of the housing cover is threadedly received. O-rings 26 and 27 extend about the inner and outer edges of base portion 33 to provide seals at the lower ends of side walls 26 and 27 when cover 12 and base 13 are tightened together.

An induction coil 31 is mounted in housing 11 in the region bounded by side walls 16 and 17, top wall 18, and the annular portion 23 of base 13. As illustrated, this coil consists of a plurality of turns of a suitable conductor, such as hollow copper tubing covered by a suitable insulative material such as a fiberglass wrapped formvar coating. The coil is disposed concentrically of the housing and proximate to inner wall 16.

The ends of coil 31 are connected to feedthrough fittings 32, 33 which extend through openings 34, 36 in the annular portion of base 13. These fittings are fabricated of an electrically conductive material, and they provide means for connecting the coil to a source of RF energy externally of the housing. The feedthrough fittings have flow passages which communicate with the opening in the tubing of which the coil is formed, and fluid connections are made to the fittings for circulating a coolant through the coil to cool the same. The housing structure is not essential to the invention, and the invention can be practiced without the housing. Likewise, it will be understood that the induction heating system is described by way of example only and that other suitable heaters, such as a resistance heater, can be utilized, if desired.

Means is provided for holding an evaporant or material to be vaporized at a predetermined position within the field of coil 31. This means includes a crucible 41 which is supported by a pedestal 42 having a platform 43 and an axially extending stem 44. The stem extends through opening 22 in base 13 and is thus accessible externally of the housing. The pedestal rests upon a cylindrical spacer 46 disposed between platform 43 and the raised portion 21 of base 13. A cup-shaped heat shield 47 rests upon the pedestal platform, and crucible 41 rests upon a spacer 48 which rests upon the bottom wall of the heat shield.

In the preferred embodiment, crucible 41 is fabricated of a dielectric material so that energy from coil 31 will heat the evaporant rather than the crucible. However, if desired, the crucible can be fabricated of any suitable material, including carbon, vitreous carbon, and other electrically conductive materials. Pedestal 42 and spacers 46, 48 are fabricated of a high temperature insulative material such as alumina or other suitable ceramic. Heat shield 47 is preferably fabricated of a low density ceramic material such as a refractory metal oxide, and it serves to reflect heat radiated by the material in the crucible back to the crucible. In addition, it provides means for containing the molten evaporant in the event that the crucible should fail.

In the event that the material to be vaporized is a dielectric material, a generally cylindrical susceptor 49 is mounted in the crucible. This susceptor is fabricated of an electrically conductive material such as carbon, vitreous carbon, tungsten or tantalum.

A block 51 is mounted on the top wall 18 of housing assembly 11 and secured thereto by suitable means, not shown. Block 51 has an axially extending bore 52, which receives the upper portion of heat shield 47. An annular insert 54 is mounted in an axially extending counterbore 56 in the upper portion of block 51. The insert has an axial opening 57 which cooperates with crucible 41 and block 51 to define a chamber 58 above the material in the crucible. Block 51 and insert 54 can be fabricated of either an RF conductive material such as graphite or an RF insulative material such as alumina, depending on the effect desired. In one presently preferred embodiment, the block and insert are fabricated of graphite and serve to preheat the upper portion of the chamber when coil 31 is energized.

Means is provided for opening and closing chamber 58. In the embodiment illustrated, this means comprises a shutter 61 which is slidably mounted on insert 54 and movable between open and closed positions. As best illustrated in FIG. 1, the shutter is generally a rectangular member having a U-shaped aperture 62 opening through one end thereof. Depending bevelled flanges 63, 64 extend along opposite sides of the shutter and mate with a bevelled grove 66 formed toward the top of insert 54 to permit lateral movement of the shutter and prevent axial movement thereof. In the preferred embodiment, insert 54 and shutter 61 are fabricated of graphite, and a tight seal is formed between the upper surface of the insert and the lower surface of the shutter. If desired, another suitable valve or closure can be utilized in place of the shutter assembly described above.

An actuator bracket 68 is affixed to the end of shutter 61 opposite aperture 62, and a connecting rod 69 extends between the bracket and a suitable actuator such as a hydraulic or pneumatic cylinder, not shown, which serves to move the shutter between its open and closed positions.

Means is also provided for injecting additional materials into chamber 58 to further enhance the effectiveness of the vapor in coating or to prevent undesired reactions in the coating process. In the embodiment illustrated, this means includes a plurality of inlet passageways 71 extending radially through block 51 and connected to a manifold 72 externally of the housing. The manifold is connected to a suitable source, not shown, for injecting the desired material into the chamber.

Operation and use of the apparatus and therein the method of the invention are as follows: It is assumed that vapor source 10 is mounted in a suitable vacuum chamber and that objects to be coated are located above the source in the chamber. It is further assumed that feedthrough fittings 32, 33 have been connected to a suitable source of RF energy and to suitable coolant lines. The evaporant or material to be vaporized 73 is placed in crucible 41, and if the material is a dielectric material, susceptor 49 is also placed in the crucible. Thereafter, shutter 61 is moved to its closed position, with aperture 62 out of alignment with opening 57, and chamber 58 and the chamber above the source are both evacuated. RF energy is then applied to coil 31 to heat the materials in the crucible by inducing heating. As the heat of vaporization for the material is exceeded, a pressure is built up in chamber 58 above the evaporant. This pressure build-up allows the evaporant temperature to be further increased while evaporation is limited by the increasing pressure in the closed chamber. By this means, the evaporant can be super-heated, resulting in relatively high saturated vapor pressure in the chamber.

Evaporant temperature higher than normally possible with prior art techniques are reached since evaporation is prohibited by increased pressure within the chamber. Additional kinetic energy is present in vapor prior to release due to both elevated temperature and differential pressure between the chamber and the surrounding vacuum prior to opening valve.

While the chamber is closed, additional materials can be injected through manifold 72 and passageways 71, if desired. For example, in the deposition of $SiO_2$, the vapor can be enriched with $O_2$ to reduce the amount of SiO which might otherwise be deposited. When oxidizing materials are injected, it may be desirable to first inject an inert gas, such as argon or nitrogen, to protect the graphite. The inert gas can then be replaced with the desired oxide before the shutter is opened.

When the temperature and pressure in chamber 58 have reached the desired level and any additional materials have been injected, shutter 61 is moved to its open position, with aperture 62 aligned with opening 57, and the vapor is released for application to the objects to be coated in a super-heated, high pressure state with high kinetic energy.

When super-heated, some evaporants display a tendency to eject liquid droplets which can collide with the objects being coated, resulting in an unusable coating. In many cases, these droplets are ejected due to a high pool activity level caused by boiling or vapor release at the interface between the molten pool and the crucible. This phenomenon is most evident when the crucible is fabricated of an electrically conductive material and the induced RF energy is coupled to the crucible, with the result that the crucible is at a higher temperature than the evaporant and heat flow occurs from the crucible to the evaporant. This problem can be avoided by deenergizing the induction coil and allowing the crucible and evaporant to reach a condition of temperature equilibrium before the shutter is opened. Thereafter, when the shutter is opened, a very high burst of evaporation is provided, with a minimum of ejected droplets.

The invention has a number of important features and advantages. Because of the high vapor density and kinetic energy level of the released vapor, deposition occurs at a high rate, and very favorable "around the corner" or "backside" coating is possible, as opposed to the normal cosine distribution characteristic of conventional vapor deposition sources. For a given thickness of coating, the temperature of the substrate or other object being coated remains substantially below the temperature reached during the deposition of a coating of the same thickness by conventional techniques. This limited rise in substrate temperature is particularly advantageous where the substrate is plastic or another material whose structural properties change at a relatively low temperature.

The invention can be utilized with a wide variety of evaporant and substrate materials. For example, the evaporant can be a metal or a dielectric, and the material being coated can be any material susceptible to vacuum deposition.

While conventional evaporation sources are limited to a distribution pattern perpendicular to the surface of the evaporant, the vapor source of the invention can direct the vapor at any desired angle relative to the surface of the evaporant. In a conventional source, the vapor is initiated at the evaporant surface, which is totally or partially liquid, and is held in a crucible, hearth or the like by gravity. However, in the vapor source of the invention, the vapor discharge is from the super-heated high pressure vapor entrapped in the chamber between the shutter and the source. The orientation of the shutter can therefore be changed to permit vapor discharge in any desired direction, e.g. parallel to the surface of the evaporant.

The injection of additional materials into the closed chamber also has a number of advantages. The materials are injected at a temperature at which the vapor is in a highly reactive state. This technique permits the deposition of chemical compounds not otherwise easily deposited with open chamber techniques. This technique also makes it possible to compensate for loss of components from the material to be deposited, which sometimes happens when open sources are used. For example, when $SiO_2$ is heated in an open source, oxygen is normally lost from the system, and the resulting depositions are richer in silicon than would be indicated by the chemical formula $SiO_2$. By flowing oxygen into the closed chamber prior to opening, compensation can be made for the lost oxygen, and depositions can be made which approach $SiO_2$ composition. It will be understood that the deposition of $SiO_2$ is described by way of example only, and this technique can be applied to materials in general which tend to lose one or more components when heated in an open chamber.

It is apparent from the foregoing that a new and improved vapor deposition method and apparatus have been provided. While only the preferred embodiments have been described, as will be apparent to those familiar with the art, certain changes and modifications can be made without departing from the scope of the invention as defined by the following claims.

I claim:

1. In a method for effecting vapor deposition of a material on an object, the steps of:
   A. heating the material in a chamber isolated from the object to vaporize the material;
   B. maintaining the chamber in a sealed condition and heating the vaporized material to an elevated temperature and pressure to form a vapor of high kinetic energy; and
   C. opening the chamber to effect a rapid release of the highly pressurized vapor from the chamber to the object.

2. The method of claim 1 wherein the material is heated by placing the same in a crucible disposed in the field of an inductor coil energized with RF energy.

3. The method of claim 2 wherein the coil is deenergized before the chamber is opened.

4. The method of claim 1 further including the step of injecting an additional material into the chamber before the chamber is opened.

5. The method of claim 1 wherein the vapor is heated to a superheated state before the chamber is opened.

6. The method of claim 1 wherein the material is heated in a crucible and the crucible and material are permitted to reach thermal equilibrium before the chamber is opened.

* * * * *